US011898241B2

(12) United States Patent
Beldi et al.

(10) Patent No.: US 11,898,241 B2
(45) Date of Patent: Feb. 13, 2024

(54) METHOD FOR A TREATMENT TO DEPOSIT A BARRIER COATING

(71) Applicant: INNOVATIVE SYSTEMS ET TECHNOLOGIES (ISYTECH), Lannion (FR)

(72) Inventors: Nasser Beldi, Trebeurden (FR); Fabrice Oge, Lannion (FR); Patrick Chollet, Lannion (FR); Mikaël Jaouen, Tébeurden (FR)

(73) Assignee: INNOVATIVE SYSTEMS ET TECHNOLOGIES (ISYTECH), Lannion (FR)

( * ) Notice: Subject to any disclaimer, the term of this patent is extended or adjusted under 35 U.S.C. 154(b) by 0 days.

(21) Appl. No.: 17/423,788

(22) PCT Filed: Jun. 17, 2019

(86) PCT No.: PCT/FR2019/051465
§ 371 (c)(1),
(2) Date: Jul. 16, 2021

(87) PCT Pub. No.: WO2020/148487
PCT Pub. Date: Jul. 23, 2020

(65) Prior Publication Data
US 2022/0112595 A1 Apr. 14, 2022

(30) Foreign Application Priority Data

Jan. 17, 2019 (FR) ...................................... 1900426

(51) Int. Cl.
| C23C 16/511 | (2006.01) |
| C23C 16/04 | (2006.01) |
| C23C 16/44 | (2006.01) |
| H01J 37/32 | (2006.01) |

(52) U.S. Cl.
CPC ........ *C23C 16/045* (2013.01); *C23C 16/4409* (2013.01); *C23C 16/511* (2013.01); *H01J 37/32192* (2013.01); *H01J 37/32394* (2013.01)

(58) Field of Classification Search
CPC ..... C23C 16/045; C23C 16/44; C23C 16/511; C23C 16/517
See application file for complete search history.

(56) References Cited

U.S. PATENT DOCUMENTS

| 5,298,587 A | * | 3/1994 | Hu ......................... C23C 16/401 428/447 |
| 5,378,510 A | * | 1/1995 | Thomas ................. C23C 16/045 427/563 |
| 5,471,115 A | * | 11/1995 | Hikosaka ............ H01J 37/3299 315/111.41 |
| 5,902,563 A | * | 5/1999 | Pinneo ................... C23C 16/272 427/249.8 |
| 8,920,361 B2 | * | 12/2014 | Staack .................... C23C 16/52 604/24 |
| 11,025,175 B1 | * | 6/2021 | Landig ................. H10N 30/857 |
| 2002/0182101 A1 | * | 12/2002 | Koulik ...................... A61L 2/14 422/123 |
| 2004/0118347 A1 | * | 6/2004 | Groves ............... H01J 37/3053 427/569 |
| 2005/0118427 A1 | * | 6/2005 | Linden .................. C23C 16/517 428/688 |
| 2008/0188062 A1 | * | 8/2008 | Chen ................. H01L 21/02529 438/483 |
| 2008/0220177 A1 | * | 9/2008 | Hass ..................... C23C 14/228 427/598 |
| 2009/0280268 A1 | * | 11/2009 | Glukhoy ................. C23C 16/54 427/569 |
| 2013/0313480 A1 | * | 11/2013 | Dubreuil ........... H01J 37/32935 252/301.16 |
| 2015/0091442 A1 | * | 4/2015 | Mai ......................... H05H 1/46 315/111.41 |
| 2018/0170019 A1 | * | 6/2018 | Fayet ...................... B32B 27/08 |
| 2018/0216247 A1 | * | 8/2018 | Chang ................. C23C 18/1245 |
| 2018/0311939 A1 | * | 11/2018 | Larrieu ................... B65B 51/26 |

FOREIGN PATENT DOCUMENTS

| CN | 107801286 A | 3/2018 | |
| DE | 102011009347 A1 | * 5/2012 | ............. C23C 16/27 |
| EP | 1206908 A1 | * 5/2002 | ............. A22C 13/00 |

(Continued)

OTHER PUBLICATIONS

Deilmann, Michael, et al., "Silicon Oxide Permeation Barrier Coating and Plasma Sterilization of PET Bottles and Foils". Plasma Processes and Polymers, 2009, 6, 5695-5699.*

Walther, M., et al., "Multilayer barrier coating system produced by plasma-impulse chemical vapor deposition (PICVD)". Surface & Coating Technology 80 (1996) pp. 200-202.*

Bahre, H., et al., "Surface pre-treatment for barrier coatings on polyethylene terephthalate". J. Phys. D: Appl. Phys. 46 (2013) 084012 pp. 1-11.*

Hebner, Gregory A., et al., "Frequency dependent plasma characteristics in a capacitively coupled 300 mm wafer plasma processing chamber". Plasma Sources Sci. Technol. 15 (2006) 879-888.*

(Continued)

*Primary Examiner* — Bret P Chen

(57) ABSTRACT

Method for treating in an enclosure an inner surface of a container made from polymer material, in order to deposit a barrier coating there on, comprises: inserting the container into the enclosure; introducing a precursor gas into the container intended, once transformed into the plasma state, to be deposited at least partially on the inner surface of the container in order to constitute the coating; wherein the method further comprises: transforming the precursor gas into the plasma state by a combination of excitations comprising a main excitation by means of electromagnetic waves comprising microwaves, and a secondary excitation by means of an electrical discharge of alternating voltage having a frequency between 1 kHz and 15 MHz.

8 Claims, 2 Drawing Sheets

(56) References Cited

FOREIGN PATENT DOCUMENTS

| EP | 1274877 B1 | * | 1/2010 | ............ C23C 16/44 |
|---|---|---|---|---|
| FR | 2792854 A1 | | 11/2000 | |
| FR | 2880027 A1 | | 6/2006 | |
| FR | 2921388 | * | 3/2009 | ............ C23C 16/50 |
| JP | 2005325395 A | | 11/2005 | |
| JP | 2007-238666 | * | 9/2007 | ............... C08J 7/18 |
| WO | 0132513 A1 | | 5/2001 | |
| WO | 2020148487 A1 | | 7/2020 | |

OTHER PUBLICATIONS

Rauf, Shahid, et al., "Nonlinear Dynamics of Radio Frequency Plasma Processing Reactors Powered by Multifrequency Sources". IEEE Transactions on Plasma Science, vol. 27, No. 5, Oct. 1999, pp. 1329-1338.*

Mao, M.Y., et al., "Generation of diamond nuclei on amorphous SiO2 by alternating-current bias microwave plasma chemical vapor deposition". Appl. Phys. Lett., vol. 66, No. 1, Jan. 2, 1995, pp. 16-18.*

Mustafaev, A.S., et al., "Suppression of Plasma Instabilities in Space and Ground Nuclear Power Devices". Russian Plasma Physics, Mar. 2021, pp. 1-14.*

Lee, San Ju, et al., "Plasma production by multi-phase alternating current underwater discharge and its applications to disinfection of micro-organisms". Desalination and Water Treatment, vol. 51, 2013—Issue 31-33, pp. 6224-6229. Abstract Only.*

Mohsenian, Sina, et al., "Design and characterization of an electromagnetic-resonant cavity microwave plasma reactor for atmospheric pressure carbon dioxide decomposition". Plasma Processes and Polymers 2019;16, pp. 1-13.*

Xiao, Wei, et al., "A novel high-efficiency stable atmospheric microwave plasma device for fluid processing based on ridged waveguide". J. Phys. D: Appl. Phys. 50 (2017) 385201 pp. 1-10.*

Foreign Communication from a Related Counterpart Application, Written Opinion dated Jan. 20, 2020, International Application No. PCT/FR2019/051465 filed on Jun. 17, 2019.

Foreign Communication from a Related Counterpart Application, International Search Report dated Jan. 20, 2020, International Application No. PCT/FR2019/051465 filed on Jun. 17, 2019.

* cited by examiner

[Fig. 1]
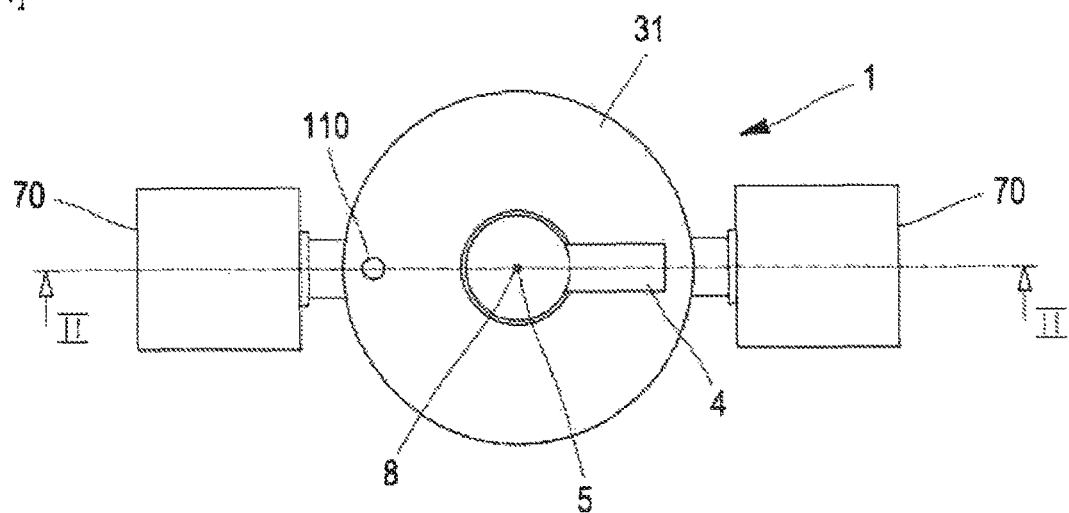
[Fig. 2]
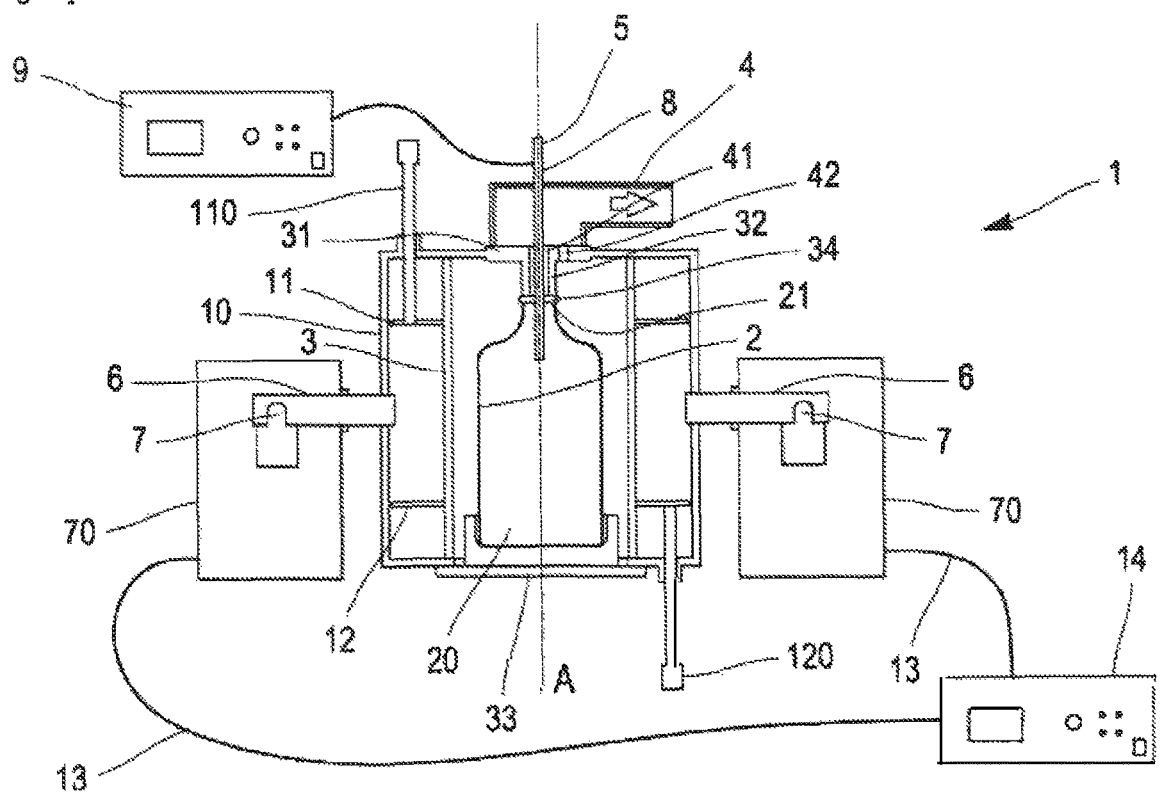

[Fig. 3]
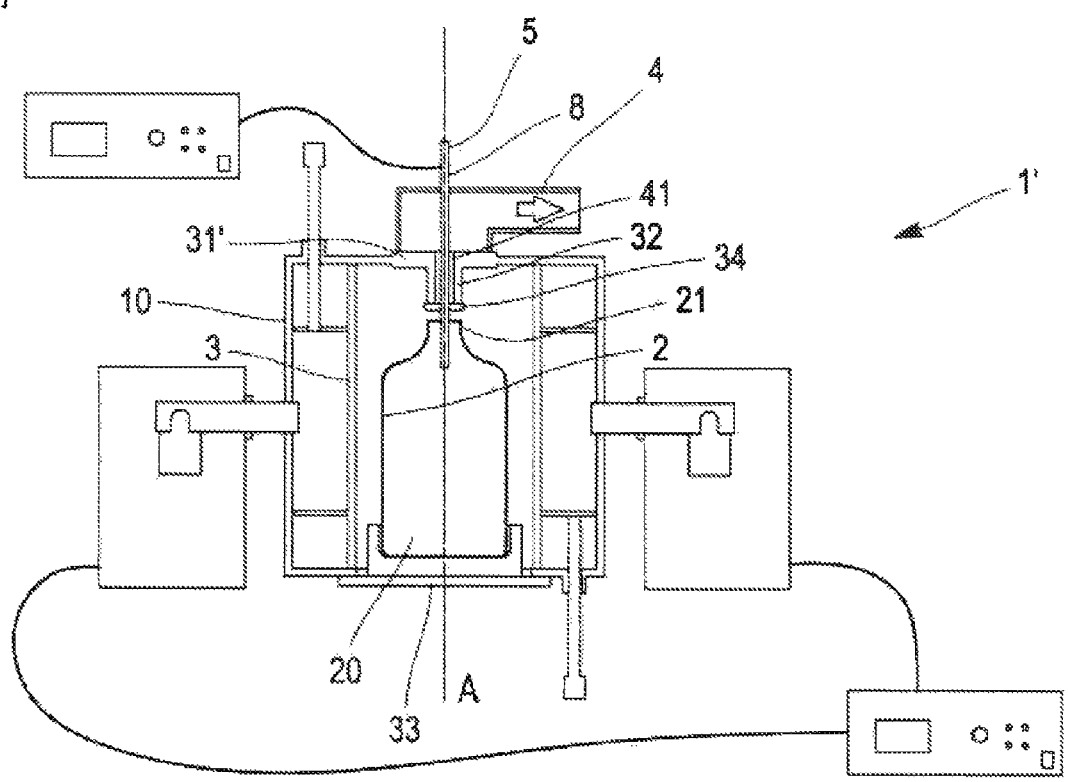

METHOD FOR A TREATMENT TO DEPOSIT A BARRIER COATING

CROSS-REFERENCE TO RELATED APPLICATIONS

The present application is a filing under 35 U.S.C. 371 as the National Stage of International Application No. PCT/FR2019/051465, filed Jun. 17, 2019, entitled "TREATMENT METHOD AND DEVICE FOR DEPOSITING A BARRIER-EFFECT COATING", which claims priority to French Application No. 1900426 filed with the Intellectual Property Office of France on Jan. 17, 2019, both of which are incorporated herein by reference in their entirety for all purposes.

FIELD OF THE INVENTION

The invention relates to the field of surface treatment for obtaining the deposition of a barrier-effect coating from a low-pressure plasma. The invention has a particular application in the field of packaging products in containers made from polymer material.

BACKGROUND

The deposition of a barrier coating on a wall of a container made from polymer material reduces the diffusion of gases and liquids through the wall.

Indeed, the use of polymers for product packaging has many advantages in terms of lightness, flexibility, strength, production and processing costs, especially in comparison with metals and glass. In particular, polyethylene, polypropylene and polyethylene terephthalate are widely used in industry.

However, these polymers are not sufficiently resistant to the diffusion of certain liquid or gaseous chemicals to allow their packaging. Among these chemicals are solvents, phytosanitary products or hydrocarbons.

It is known to deposit a barrier coating on a polymer wall in order to decrease the diffusion of gases and liquids through the wall. The document FR2880027 gives examples of methods for depositing such coatings.

The coating deposition operation is for example carried out with a technique using a plasma. This technique consists in introducing a gas known as precursor, at low pressure in an enclosure, containing the atomic elements forming the molecular structure of the coating. The precursor gas is then excited in order to be transformed into an unstable and very reactive form, called plasma, leading to a recombination and a deposition of solid material in a thin layer on the wall to be coated. A microwave energy source is commonly used to excite the precursor gas and transform it into a plasma state because it has the advantage of creating very dense plasmas, thus allowing a high deposition speed to be obtained, compatible with industrial processes. An example of a surface treatment device using microwave-generated plasma is given in document FR2792854.

Such a device consists mainly of a metallic enclosure, generally called a microwave coupling enclosure, which communicates with a waveguide allowing the introduction of microwaves into the said metallic enclosure. This device is also provided with a gas-tight dielectric material enclosure called vacuum enclosure. The container to be treated is placed in this vacuum enclosure.

BRIEF SUMMARY OF THE DRAWINGS

FIG. 1 schematically represents a top view of a device according to an embodiment of the invention; and FIG. 2 represents schematically a view of the device of FIG. 1 in vertical section according to the sectional plane II-II; and FIG. 3 schematically represents a vertical sectional view of a device according to a second embodiment of the invention.

DETAILED DESCRIPTION

In the context of industrial production, surface treatment devices using microwave-generated plasma must be able to treat the walls of container of different sizes and volumes. It is known to equip such devices with annular metal plates placed in the coupling enclosure, each plate having an adjustable position, independently of the other plate, in displacement along an axis, to vary the distribution of the microwaves in the coupling enclosure in a way adapted to the format of the container to be treated in order to obtain a good homogeneity and a good stability of the plasma inside the container to be treated. However, for certain container formats and/or certain positions of the containers in the vacuum enclosure, the metal plates do not constitute a sufficient means of adjustment and the plasma obtained may be very unstable whatever the position of the plates. Indeed, in this case, the formats used have geometries that disturb the propagation of the microwaves. The part of energy of the coupled microwaves, i.e. transmitted to the plasma, is then not sufficient to maintain a stable plasma supporting the formation of a coating with an effective barrier-effect. In addition, during industrial production, the positioning of the containers in the enclosure is not always reproducible and can sometimes vary, which also leads to disturbances in the plasma excitation. These disturbances can lead to high reject processes.

The invention proposes a solution to overcome the above-mentioned drawbacks and problems. One objective of the invention is to obtain a stable plasma regardless of the geometry and position of the container to be treated in order to deposit on its inner surface a coating with a high-performance barrier-effect.

The invention concerns a treating method in an enclosure an inner surface of a container made from polymer material, in order to deposit a barrier-effect coating there on, comprising:
  inserting the container into the enclosure,
  introducing a so-called precursor gas intended into the container that, once transformed into a plasma state is intended, to be deposited at least partially on the inner surface of the container in order to constitute the coating, and
  transforming the precursor gas into the plasma state by a combination of excitations comprising a main excitation by means of electromagnetic waves of the microwave type, and a secondary excitation by means of an electrical discharge of an alternating voltage having a frequency of between 1 kHz and 15 MHz. Preferably, the alternating voltage has a frequency between 10 kHz and 200 kHz. Microwaves are electromagnetic waves with a frequency between 300 MHz and 3000 MHz.

Preferably, the microwaves have a frequency between 915 MHz and 2450 MHz. A barrier coating is a coating applied to a wall that has the property of reducing the diffusion of gases and liquids through the wall. The main excitation by means of electromagnetic waves of the microwave type is the excitation thus allowing the transformation of the precursor gas into the plasma state and thus allowing the deposition to be carried out to constitute the barrier-effect coating. The power of the main excitation is greater than the power of the secondary excitation and it is the main excitation that provides the energy required to transform the precursor gas into the plasma state and to deposit it. The secondary excitation by means of an electrical discharge of an alternating voltage provides a stable plasma, regardless of the geometrical shape or position of the container in the coupling enclosure, i.e. a portion of the gas is transformed into plasma and remains in the plasma state for the duration of the excitation. This portion of the gas that is transformed into plasma and remains in the plasma state will then allow the main excitation by means of microwaves to be established in a stable manner for its entire duration. The combination of the main and secondary excitation is beneficial because in some cases, especially for some formats, the excitation by means of electromagnetic waves of the microwave type alone is not sufficient insofar as the transmission of the microwave energy to the plasma can be disturbed by the shape of the container and is then not completely consumed by the gas to be transformed into the plasma state. As a result, the precursor gas does not transform in a sufficiently sustainable manner to achieve a successful coating. It is important to note that excitation by means of an electrical discharge of alternating voltage alone does not provide sufficiently fast deposition rates for industrial production processes. The advantage of combining the excitation by means of electromagnetic waves of the microwave type and the excitation by means of an electrical discharge is to obtain simultaneously, the speed of treatment conferred by a plasma generated by microwaves and the stability of a plasma generated by an excitation by an electrical discharge.

According to the invention:
excitation by means of electromagnetic waves of the microwave type, and
excitation by means of an electrical discharge of alternating voltage are carried out simultaneously during a treatment phase known as the plasma phase.

According to the invention, the plasma phase duration can be between one second and 10 minutes, preferably between one second and 30 seconds.

According to the invention the effective value of the voltage of the electrical discharge can be between 100 V and 1000 V, preferably between 200 V and 500 V.

According to the invention, the precursor gas may be a gas selected from alkanes, alkenes, alkynes, aromatics, or a combination of some of these.

According to the invention the precursor gas can be a 1,1,1,2-tetrafluoroethane, pentafluoroethane, difluoromethane, acetylene, or a combination of some of them or a mixture of some of them with a rare gas such as argon.

According to the invention, the method may further comprise a prior step of surface treatment with a plasma of oxygen, hydrogen, argon, carbon dioxide, helium, nitrogen or a combination of some of these.

According to the invention, the method may include the deposition of a succession of coating layers.

According to the invention, the power density of the electromagnetic waves can be between 0.01 W/cm3 and 1 W/cm3. Thus, for a 4 L canister, the power of the electromagnetic waves can be between 40 W and 4 kW, for a 20 L canister, the power of the electromagnetic waves can be between 200 W and 20 kW.

According to the invention, the power of the electrical discharge can be between 1 W and 2000 W, preferably between 4 W and 100 W.

According to the invention, the power of the main excitation by means of electromagnetic waves of the microwave type is greater than the power of the secondary excitation by means of an electrical discharge of alternating voltage.

According to the invention, the gas can be introduced into the enclosure with a controlled flow rate so as to maintain the enclosure at a pressure between 0.002 mbar and 10 mbar, preferably between 0.01 mbar and 1 mbar.

According to the invention, the surface can be, for example and without limitation, made from polymer material such as polyethylene, polypropylene, polyamide, PET, or polyvinyl chloride.

According to the invention, the treated surface is, for example, the inner surfaces of a hollow container with an opening.

The invention also relates to a device for treating an inner surface of a container made from polymer material in order to deposit a barrier-effect coating there on, comprising:
a coupling enclosure constituting a space for propagating electromagnetic waves of the microwave type,
a gas-tight vacuum enclosure placed in the coupling enclosure and comprising a space intended to receive the container,
a pumping circuit arranged so as to generate a negative pressure in the vacuum enclosure through a suction port,
a source of gas known as a precursor gas that, once it has been transformed into a plasma state, is intended to be deposited at least partially on the inner surface of the container to constitute the coating,
a gas injector supplied by the precursor gas source and opening into the space intended to receive the container,
at least one waveguide opening into the coupling enclosure,
at least one magnetron designed and arranged so as to emit electromagnetic waves of the microwave type into the at least one waveguide the treating device further comprises:
an electrode placed at least partially in the space intended to receive the container, and
a voltage generator which is designed and arranged in such a way that it can supply the electrode with an alternating voltage with a frequency of between 1 kHz and 15 MHz. A low-pressure gas is a gas with a pressure of between 0.002 mbar and 10 mbar. The device of the invention is designed in such a way as to be able to implement the method of the invention.

According to the invention, the gas injector and the electrode can be a single element.

According to the invention, the coupling enclosure may be metallic.

According to the invention, the coupling enclosure may be cylindrical and have an axis of symmetry.

According to the invention, the vacuum enclosure can be made of dielectric material and has a low microwave absorption property.

According to the invention, the vacuum enclosure can be cylindrical and have an axis of symmetry.

According to the invention, the vacuum enclosure is concentric with the coupling enclosure.

According to the invention, the emission frequency of the electromagnetic waves of the microwave type can be 2.45 GHz and the diameter of the coupling enclosure can be between 70 and 2000 millimeters (mm).

According to the invention, the device can further comprise at least two metallic annular wave distribution plates, having the same axis of symmetry as the coupling enclosure, each plate having an adjustable position in displacement along the axis of symmetry independently of the other plate. Such plates make it possible to vary the distribution of the microwaves in the coupling enclosure in order to obtain a good homogeneity and stability of the plasma near the surface of the container to be treated.

According to the invention, the emission frequency of the electromagnetic waves of the microwave type may be 2.45 GHz and the waveguide may have a rectangular cross-section and dimensions of one quarter of the guided wavelength in the direction of the axis A of revolution of the cylinder and of one half of the guided wavelength in the perpendicular direction.

According to the invention, the device may comprise a plurality of waveguides opening into the coupling enclosure and distributed around the coupling enclosure, each waveguide being coupled to a magnetron powered by an electrical supply and designed to emit microwave type electromagnetic waves into the waveguide.

According to the invention, the device may include a control module programmed to operate the magnetron power supplies in turn or simultaneously.

According to the invention, the device can be adapted to the treatment of a surface consisting of the inner surfaces of a hollow container comprising an opening, and the vacuum enclosure being provided with a sealing cover comprising a duct surrounded by a seal designed to seal the interior from the interior of the container, the duct comprising the gas injector and the suction port. Such a duct has the advantage of positioning the gas injector and the suction port within the container.

According to the invention, the pumping circuit can also comprise another suction port opening into the vacuum enclosure outside the space intended to receive the container to be treated in order to generate a vacuum outside the container. The other suction port allows a vacuum to be created outside the container in order to compensate for the vacuum created inside the container and to prevent the container from deforming excessively when the vacuum is created inside the container. As a result of the pumping, the pressure outside the container is higher than inside the container in order to obtain a pressure favorable to the creation of a plasma inside the container and unfavorable to the creation of the plasma outside the container. Moreover, the pressure outside the container is low enough to limit the pressure differential between the inside and the outside of the container in order to avoid deformation of the container.

According to the invention, the coupling enclosure can be confused with the vacuum enclosure. In this case, the enclosure is microwave-tight and gas-tight. The presence of only one enclosure instead of two saves space and simplifies the device.

Other features and advantages of the present invention will become clearer upon reading the following detailed description of a non-limiting exemplary embodiment of the invention illustrated by the appended drawings, in which:

BRIEF DESCRIPTION OF THE SEVERAL VIEWS OF THE DRAWINGS

FIGS. 1 and 2 show a device 1 for treating a surface 2 to deposit a barrier coating on it. The surface 2 is made of polymer and consists of the inner surfaces of a hollow container 20. The container 20 has an opening 21. The container is typically a bottle or canister.

The device 1 comprises:
a coupling enclosure 10,
a vacuum enclosure 3,
a pumping circuit 4,
a gas source (not shown),
a gas injector 5,
two waveguides 6,
two magnetrons 7,
an electrode 8,
a voltage generator 9,
two plates 11 and 12
a control module 14,
a cover 31, and
a base 33.

The gas source comprises a precursor gas to be transformed into a plasma state and then deposited at least partially on the inner surface 2 of the container to constitute the coating. The gas source is, for example, a pressurized gas cylinder or a wall supply.

The coupling enclosure 10 is metallic so as to be microwave-tight. The microwaves are intended to propagate in the coupling enclosure 10 while being confined therein. The coupling enclosure is cylindrical in shape and has a rotationally symmetrical axis A. By way of illustration and not as a limitation, the diameter of the coupling enclosure can be between 70 and 2000 millimeters (mm).

The vacuum enclosure 3 is intended to receive the container 20 to be treated, as illustrated in FIG. 2. The vacuum enclosure 3 is gastight in order to allow the treatment to be carried out under a modified atmosphere. In particular, the treatment is carried out at low pressure, between 0.002 mbar and 10 mbar.

The vacuum enclosure 3 is dielectric and has a low microwave absorption property so that the energy carried by the microwaves can be transmitted to the gas in it without being absorbed by the vacuum enclosure 3 itself.

The vacuum enclosure 3 is placed in the coupling enclosure 10. The vacuum enclosure is cylindrical and has the same axis A of rotational symmetry as the coupling enclosure 10. The vacuum enclosure 3 and the coupling enclosure 10 are therefore concentric.

In a variant not shown, the coupling enclosure 10 is merged with the vacuum enclosure 3. In this case, the enclosure is microwave-tight and gas-tight.

The cover 31 allows for the vacuum enclosure 3 to be sealed in a watertight manner. The cover 31 may be removable or attached to the vacuum enclosure 3. The cover 31 includes a duct 32, provided with a seal 34, sealingly separating the interior from the exterior of the enclosure. Thus, the precursor gas can be confined to the inside of the container 20 and the pressure in the container 20 can be different from the pressure outside the container 20. The conduit 32 includes the gas injector 5 and a suction port 41 connected to the pumping circuit The duct 32 positions the gas injector 5 and the suction port 41 in the container 20.

The base 33 is removable. It is arranged to support the container and allows the loading and unloading of the container, the container being placed on the base 33.

According to a first embodiment shown in FIGS. 1 and 2, the pumping circuit comprises two suction ports, including the suction port 41 located in the duct 32 and a second suction port 42 equipped with an isolation valve and opening into the vacuum enclosure outside the duct 32 to generate a vacuum outside the container 20. In the example shown, the second suction port 42 is located in the cover 31. The pumping circuit 4 is arranged to generate a vacuum on the one hand through the suction port 41 and on the other hand, when the isolation valve is open, through the second suction port 42. The suction port 41 allows a vacuum to be created inside the container 20. The second suction port 42 allows a vacuum to be created outside the container in order to compensate for the vacuum created inside the container 20 and to prevent the container from deforming.

A device 1' according to a second embodiment is shown in FIG. 3. The device 1' of the second embodiment differs from the device 1 of the first embodiment in that the pumping circuit has only one suction port, namely the suction port 41 located in the duct 32. In this second embodiment, the cover 31' of the device 1' does not comprise a second suction port 42. The relative position of the container 20 with respect to the duct 32 is variable between a first position and a second position. In the first position, the duct 32 provided with the seal 34 is not in contact with the opening of the container and the pumping circuit can then perform a suction in the whole enclosure, the pressure inside the container being then equal to the pressure outside the container. In the second position, the duct 32 fitted with the seal 34 is in tight contact with the opening of the container and the pumping circuit performs suction only in the container. Thus, it is possible to obtain a pressure differential between the inside of the container and the outside of the container with a lower pressure inside the container. For example, the container is placed on a support that is operable between a lowered position and an elevated position, the support allowing the container to be moved between the first position and the second position. This second embodiment eliminates pressure drop problems within the pumping circuit present in the first embodiment, which induce deformations of the containers. These pressure drop problems are due to poor pressure balancing between the two ports. A good balancing is difficult to find because of the high production processes.

The gas injector 5 is fed by the precursor gas source and opens into the space intended to receive the container 20 to be treated. The gas is injected in a controlled manner to obtain a pressure between 0.002 mbar and 10 mbar in the container 20. The pressure can be monitored by a pressure sensor and the gas flow rate in the gas injector can be monitored by a flow meter.

The waveguides 6 open into the coupling enclosure 10 and are distributed around the coupling enclosure 10. In the example, they are diametrically opposed with respect to the diameter of the cylinder formed by the coupling enclosure 10. Each waveguide has a rectangular cross-section and has dimensions of one quarter of the guided wavelength along the direction of the axis A of revolution of the coupling enclosure 10 and one half of the guided wavelength along the transverse direction of the coupling enclosure 10, i.e., a direction tangent to the perimeter of the cylinder formed by the coupling enclosure 10.

Each magnetron 7 is designed and arranged to emit microwave electromagnetic waves into the adjoining waveguide 6. Each magnetron is powered by an electrical power supply 13 of an alternating voltage and is designed to emit microwave type electromagnetic waves, of frequency between 915 Mhz and 2450 MHz, into the adjoining waveguide 6. Each magnetron 7 is placed in a housing 70.

The device may include a control module 14 programmed to operate the magnetron power supplies in turn or simultaneously.

The electrode 8 is placed at least partially in the vacuum enclosure 3. The gas injector and the electrode are here a single element. Thus, the gas injector is tubular, preferably metallic with good electrical conductivity properties.

The voltage generator 9 is designed and arranged to supply the electrode 8 with an alternating voltage at a frequency between 1 kHz and 15 MHz.

The two plates 11 and 12 are annular and metallic. The plates 11 and 12 have the same axis of symmetry as the coupling enclosure. Each plate 11 or 12 has an adjustable position in a movement along the axis of symmetry independently of the other plate 11 or 12. The plates 11 and 12 have adjustment means 110 and 120 respectively. The adjusting means comprise, for example, a screw and a knob for rotating the screw. Such plates 11 and 12 make it possible to vary the distribution of the microwaves in the coupling enclosure in order to obtain a good homogeneity and stability of the plasma in the vicinity of the surface to be treated The device described above enables the treatment method of the invention to be carried out. The treatment method makes it possible to deposit a coating with a barrier-effect on a surface made of polymeric material.

The surface is for example and without limitation made of a polymeric material such as polyethylene, polypropylene, polyamide, PET, or polyvinyl chloride.

The treating method comprises the following steps:
introducing the container 20 into the vacuum enclosure 3,
carrying out a pumping cycle in the vacuum enclosure 3 and in the container 20 by means of the pumping circuit 4,
introducing a precursor gas into the container 20,
transforming the precursor gas into the plasma state by means of a double excitation.

The container 20 is inserted into the vacuum enclosure 3 as follows. The removable base 33 is removed from the vacuum enclosure 3, the container 20 to be treated is placed on the base 33 and the base 33 is repositioned so that the vacuum enclosure is sealed.

In the case of a device 1 according to the first embodiment shown in FIG. 2, the pumping cycle is performed as follows. The container 20 is positioned so that the seal 34 of the duct 32 comes into contact with the opening 21 of the container to isolate the inner part from the outer part of the container 20. In a first phase of the pumping cycle, the isolation valve is opened and pumping is activated so as to simultaneously drop the pressure in the container 20 through the suction port 41 and in the rest of the vacuum enclosure 3 through the second suction port 42. Thus, the pressure in the container 20 and in the vacuum enclosure 3 drops from a value corresponding to atmospheric pressure to a first predetermined value P1. In a second phase of the pumping cycle, the isolation valve is closed and pumping continues only through the suction port 41 in the container. Thus, the pressure in the container 20 continues to drop to a second predetermined value P2, lower than the first predetermined value P1, while the pressure in the rest of the vacuum enclosure 3 is maintained at the first predetermined value P1.

In the case of a device 1' according to the second embodiment shown in FIG. 3, the pumping cycle is performed as follows. The container 20 is positioned so that the seal 34 of the duct 32 is not in contact with the opening 21 of the container so that the inner part and the outer part of the container 20 communicate. In a first phase of the pumping cycle, the pumping is activated so as to simultaneously drop the pressure in the container and in the rest of the vacuum enclosure 3 through the suction port 41. Thus, the pressure in the container 20 and in the vacuum enclosure 3 drops from a value corresponding to the atmospheric pressure to a first predetermined value P1. In a second phase of the pumping cycle, the container 20 is positioned so that the seal 34 of the duct 32 comes into contact with the opening 21 of the container to isolate the inner part from the outer part of the container 20 and pumping continues only in the container through the suction port 41. Thus, the pressure in the container 20 continues to drop to a second predetermined value P2 while the pressure in the remainder of the vacuum enclosure 3 is maintained at the first predetermined value P1.

According to the method of the invention, following pumping, the pressure is greater outside the container 20 than inside the container in order to obtain a pressure favorable to the creation of a plasma inside the container 20 and unfavorable to the creation of the plasma outside the container 20. In addition, the pressure outside the container is low enough to limit the pressure differential between the interior and the exterior of the container to avoid deformation of the container.

The precursor gas is introduced into the container 20 through the gas injector 5.

The precursor gas is intended, once transformed into the plasma state, to be deposited at least partially on the inner surface 2 of the container 20 to constitute the coating. The precursor gas may be a gas selected from alkanes, alkenes, alkynes, aromatics, or a combination of some of them. In particular, the precursor gas may be a gas of 1,1,1,2-tetrafluoroethane, pentafluoroethane, difluoromethane, acetylene, or a combination of some of them or a mixture of some of them with a rare gas such as argon.

The method may further comprise a prior step of surface treatment with a plasma of oxygen, hydrogen, argon, carbon dioxide, helium, nitrogen or a combination of some of them. In addition, the method may include the deposition of a succession of coating layers.

The gas is introduced into the enclosure with a controlled flow rate so as to maintain the enclosure at a pressure between 0.01 mbar and 1 mbar.

The double excitation comprises:
an excitation by means of electromagnetic waves of microwave type, and
an excitation by means of an electrical discharge. The excitation by means of electromagnetic waves of the microwave type, and the excitation by means of an electrical discharge are carried out simultaneously during a phase of the treatment known as plasma phase. The plasma phase duration is between one second and 30 seconds.

The excitation by means of electromagnetic waves of microwave type is carried out with a frequency ranging between 915 Mhz and 2450 MHz. The power density of the electromagnetic waves is between 0.01 W/cm3 and 1 W/cm3.

Excitation by means of an electrical discharge is carried out with an alternating voltage having a frequency between 20 kHz and 200 kHz. The effective value of the voltage of the electrical discharge is for example between 200 V and 500 V. The power of the electrical discharge is then between 4 W and 30 W.

It will be understood that various modifications and/or improvements obvious to the person skilled in the art may be made to the various embodiments of the invention described in the present description without departing from the scope of the invention defined by the appended claims.

The invention claimed is:

1. Method for treating in an enclosure an inner surface of a container made from polymer material in order to deposit a barrier coating there on, comprising:
inserting the container into the enclosure,
introducing a precursor gas into the container, wherein the precursor gas is intended, once transformed into the plasma state, to be deposited at least partially on the inner surface of the container in order to constitute the coating, the method being characterized in that it furthermore comprises:
transforming the precursor gas into the plasma state by a combination of excitations comprising a main excitation by means of electromagnetic waves comprising microwaves, and a secondary excitation by means of an electrical discharge of alternating voltage having a frequency of between 1 kHz and 15 MHz, wherein the secondary excitation stabilizes the plasma state generated by the main excitation, wherein the excitation by means of electromagnetic waves comprising microwaves and the excitation by means of an electrical discharge of alternating voltage are carried out simultaneously during a treatment phase known as a plasma phase, and wherein a power of the main excitation is greater than a power of the secondary excitation.

2. Treating method according to claim 1 characterized in that the plasma phase duration is between one second and 10 minutes.

3. Treating method according to claim 1, characterized in that the effective value of the voltage of the electrical discharge is between 100 V and 1000 V.

4. Treating method according as claimed in claim 1, characterized in that the precursor gas is a gas of 1,1,1,2-tetrafluoroethane, pentafluoroethane, difluoromethane, acetylene, or a combination of some of them or a mixture of some of them with a rare gas.

5. Treating method as claimed in claim 1, characterized in that the power of the electrical discharge is between 1 W and 2000 W.

6. Treating method as claimed in claim 1, characterized in that the gas is introduced into the enclosure with a controlled flow rate so as to maintain the enclosure at a pressure of between 0.002 mbar and 10 mbar.

7. The method of claim 1, wherein the main excitation provides the energy to transform the precursor gas into the plasma, and wherein the secondary excitation stabilizes the plasma transformed by the main excitation.

8. The method of claim 1, wherein the main excitation is introduced into the enclosure through at least one waveguide opening, and wherein the secondary excitation is generated by at least one electrode placed within the container.

* * * * *